United States Patent
Lee et al.

(10) Patent No.: US 7,138,869 B2
(45) Date of Patent: Nov. 21, 2006

(54) AMPLIFIER CIRCUIT

(75) Inventors: Chao-Cheng Lee, HsinChu (TW); Jui-Cheng Huang, Hsinchu (TW); Jui-Yuan Tsai, Tainan (TW); Wen-Chi Wang, Siluo Township, Yunlin County (TW)

(73) Assignee: Realtek Semiconductors Corp., Hsinchu (CN)

( * ) Notice: Subject to any disclaimer, the term of this patent is extended or adjusted under 35 U.S.C. 154(b) by 38 days.

(21) Appl. No.: 10/748,667

(22) Filed: Dec. 31, 2003

(65) Prior Publication Data

US 2004/0232981 A1  Nov. 25, 2004

(30) Foreign Application Priority Data

Jan. 10, 2003 (TW) .............. 92100495 A (51) Int. Cl.
*H03G 3/12* (2006.01)
(52) U.S. Cl. ............ 330/282; 330/284; 330/278; 330/291
(58) Field of Classification Search ........ 330/282, 330/284, 278, 291
See application file for complete search history.

(56) References Cited

U.S. PATENT DOCUMENTS

| | | | | | |
|---|---|---|---|---|---|
| 3,617,959 | A | | 11/1971 | Brander | |
| 3,863,200 | A | * | 1/1975 | Miller | 367/65 |
| 3,863,201 | A | * | 1/1975 | Briggs et al. | 367/65 |
| 4,037,170 | A | * | 7/1977 | Richards | 330/69 |
| 4,082,998 | A | | 4/1978 | Marriott | |
| 4,250,492 | A | | 2/1981 | Yamakido et al. | |
| 4,484,295 | A | * | 11/1984 | Bedard et al. | 708/8 |
| 5,231,627 | A | * | 7/1993 | Paul et al. | 369/125 |
| 5,525,985 | A | * | 6/1996 | Schlotterer et al. | 341/136 |
| 6,127,893 | A | * | 10/2000 | Llewellyn et al. | 330/284 |
| 6,545,534 | B1 | * | 4/2003 | Mehr | 330/69 |
| 6,608,516 | B1 | | 8/2003 | Lennous et al. | |
| 6,703,682 | B1 | * | 3/2004 | Aswell | 257/536 |
| 2001/0033196 | A1 | | 10/2001 | Lennous et al. | |

* cited by examiner

*Primary Examiner*—Patricia Nguyen
(74) *Attorney, Agent, or Firm*—Rabin & Berdo, P.C.

(57) ABSTRACT

An amplifier circuit having a high time constant. An operational amplifier includes a non-converting input terminal coupled to a ground, a converting input terminal and an output terminal. A first resistor network including at least one stage is coupled between the converting input terminal and the output terminal. Each stage of the first resistor network includes a first node, a first current path and a second current path connected to the first node. The first current path of each stage of the first resistor network is connected to the first node of the next stage, the second current path of each stage of the first resistor network is grounded, and the first current path of the first stage of the first resistor network is connected to the converting input terminal. A loading unit is coupled between the converting input terminal and the output terminal.

15 Claims, 7 Drawing Sheets

AMPLIFIER CIRCUIT

CROSS REFERENCE TO RELATED APPLICATIONS

The subject matter of the present application is related to that of the applicants' copending U.S. patent application entitled FILTER CIRCUIT, filed concurrently herewith on Dec. 31, 2003, and commonly owned by the assignee of the present application, and the disclosure of which is hereby incorporated by reference. The present application also incorporates by reference the disclosure of applicants' prior corresponding Taiwan Application No. 92100495, filed Jan. 10, 2003, the foreign priority benefit of which is claimed herein.

BACKGROUND OF THE INVENTION

The present invention relates in general to an amplifier circuit. In particular, the present invention relates to an amplifier circuit using a resistor network to implement an equivalent resistor with large resistance.

DESCRIPTION OF THE RELATED ART

FIGS. 1~4 are circuit diagrams of a conventional integrator, differentiator, low-pass filter and high-pass filter, respectively. The integrator shown in FIG. 1 comprises an operational amplifier 10, a capacitor $C_{11}$, and a resistor $R_{11}$. The relationship between the output terminal Vout and the input terminal Vin of the integrator is Vout/Vin=−1/SRC, wherein R and C respectively represent the resistance and the capacitance of the resistor $R_{11}$ and the capacitor $C_{11}$. The time constant of the integrator is the product of the resistor $R_{11}$ and the capacitor $C_{11}$.

Figure 1:
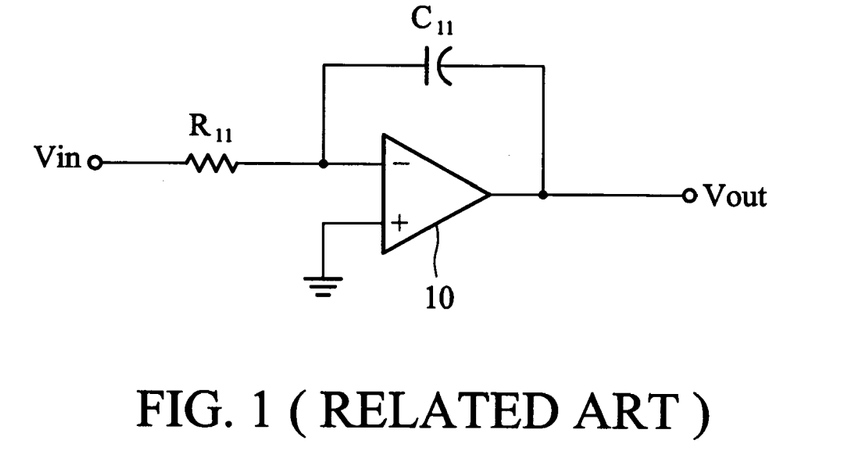
FIGS. 1~4 are circuit diagrams of the conventional integrator, differentiator, low-pass filter and high-pass filter, respectively.
Figure 2:
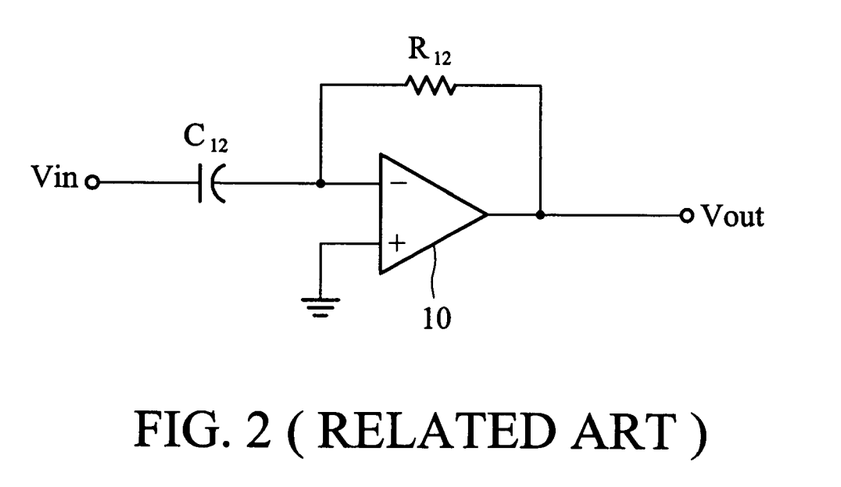

The differentiator shown in FIG. 2 comprises an operational amplifier 10, a resistor $R_{12}$, and a capacitor $C_{12}$. The relationship between the output terminal Vout and the input terminal Vin of the integrator is Vout/Vin=−SRC, wherein R and C respectively represent the resistance and the capacitance of the resistor $R_{12}$ and the capacitor $C_{12}$. The time constant of the differentiator is the product of the resistor $R_{12}$ and the capacitor $C_{12}$.

Figure 3:
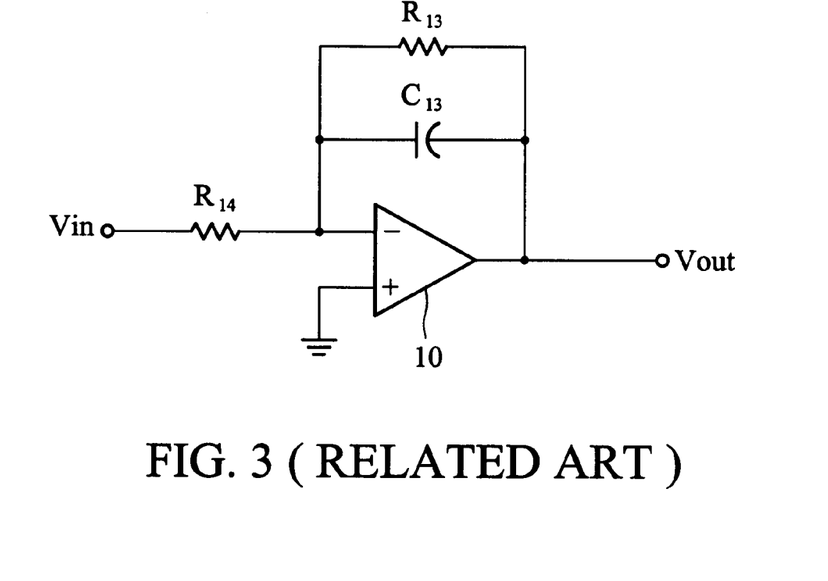

The low-pass filter shown in FIG. 3 comprises an operational amplifier 10, a resistor $R_{13}$, a resistor $R_{14}$, and a capacitor $C_{13}$. The relationship between the output terminal Vout and the input terminal Vin of the low-pass filter is Vout/Vin=−($R_{13}/R_{14}$)·1/(1+$SR_{13}C_{13}$), wherein the time constant of the low-pass filter is the product of the resistor $R_{13}$ and the capacitor $C_{13}$.

Figure 4:
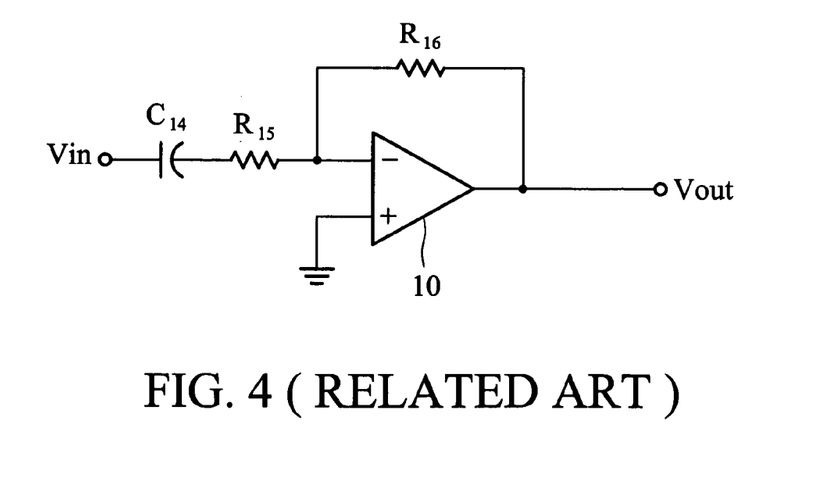

The high-pass filter shown in FIG. 4 comprises an operational amplifier 10, a resistor $R_{15}$, a resistor $R_{16}$, and a capacitor $C_{14}$. The relationship between the output terminal Vout and the input terminal Vin of the high-pass filter is Vout/Vin=−$SR_{16}C_{14}$/(1+$SR_{15}C_{16}$), wherein the time constant of the high-pass filter is the product of the resistor $R_{15}$ and the capacitor $C_{14}$.

Take the low-pass filter shown in FIG. 3 as an example, the cutoff frequency of the is determined by adjusting the resistance of $R_{11}$ and the capacitance of $C_{11}$, wherein the cutoff frequency is $$\frac{1}{R_{11} \cdot C_{11}}.$$

When the cutoff frequency is set at 10 Hz, the product of the resistance of the resistor $R_{11}$ and the capacitance of the capacitor $C_{11}$ must be $$\frac{1}{2 \cdot \pi \cdot 10}.$$

However, a reasonable capacitance of a capacitor made by the common semiconductor process is 10 Pf, at which, the resistance of the resistor R1 must be 1592 Meg, which is an unreasonable value. The area requirement of the common semiconductor process to form a resistor with the resistance of 1592 Meg must be 1262 u·1262 um², which is unreasonable large to the modern IC circuit device. Thus, it is difficult to form a resistor having a very large resistance. In addition, the differentiator, integrator, and high-pass filter respectively shown in FIGS. 1, 2, and 4 suffer the same problem while requiring the same time constant. Thus, the time constant of the conventional amplifier circuit is limited by the resistance and the capacitance of the semiconductor device, thus deteriorating the effect of the conventional amplifier circuit.

SUMMARY OF THE INVENTION

The object of the present invention is thus to provide an operational amplifier circuit having a high time constant for semiconductor structure.

In addition, another object of the present invention is to provide an operational amplifier circuit achieving high time constant using resistor network structure with a large equivalent resistance without occupying a large IC area.

To achieve the above-mentioned object, the present invention provides an amplifier circuit having a high time constant. An operational amplifier includes a non-inverting input terminal coupled to a ground, a inverting input terminal and an output terminal. A first resistor network including at least one stage is coupled between the inverting input terminal and the input terminal. Each stage of the first resistor network includes a first node, a first current path and a second current path connected to the first node. The first current path of each stage of the first resistor network is connected to the first node of the next stage, the second current path of each stage of the first resistor network is grounded, and the first current path of the first stage of the first resistor network is connected to the inverting input terminal. A loading unit is coupled between the inverting input terminal and the output terminal.

In addition, the present invention provides another amplifier circuit having a high time constant. An operational amplifier includes a non-inverting input terminal coupled to a ground, a inverting input terminal and an output terminal. A resistor network including a plurality of stages is connected between the inverting input terminal and the output terminal. Each stage of the resistor network includes a node, a first current path and a second current path connected to the node. The first current path of each stage of the resistor network is connected to the node of the next stage of the resistor network, the second current path of each stage resistor network is grounded, and the first current path of the last stage of the resistor network is connected to the inverting input terminal. A loading unit is coupled to the inverting input terminal.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The amplifier circuit according to the embodiments of the present invention used a resistor network to implement an equivalent resistor with large resistance. The circuit structure of the resistor network is described as follows.

Figure 5:
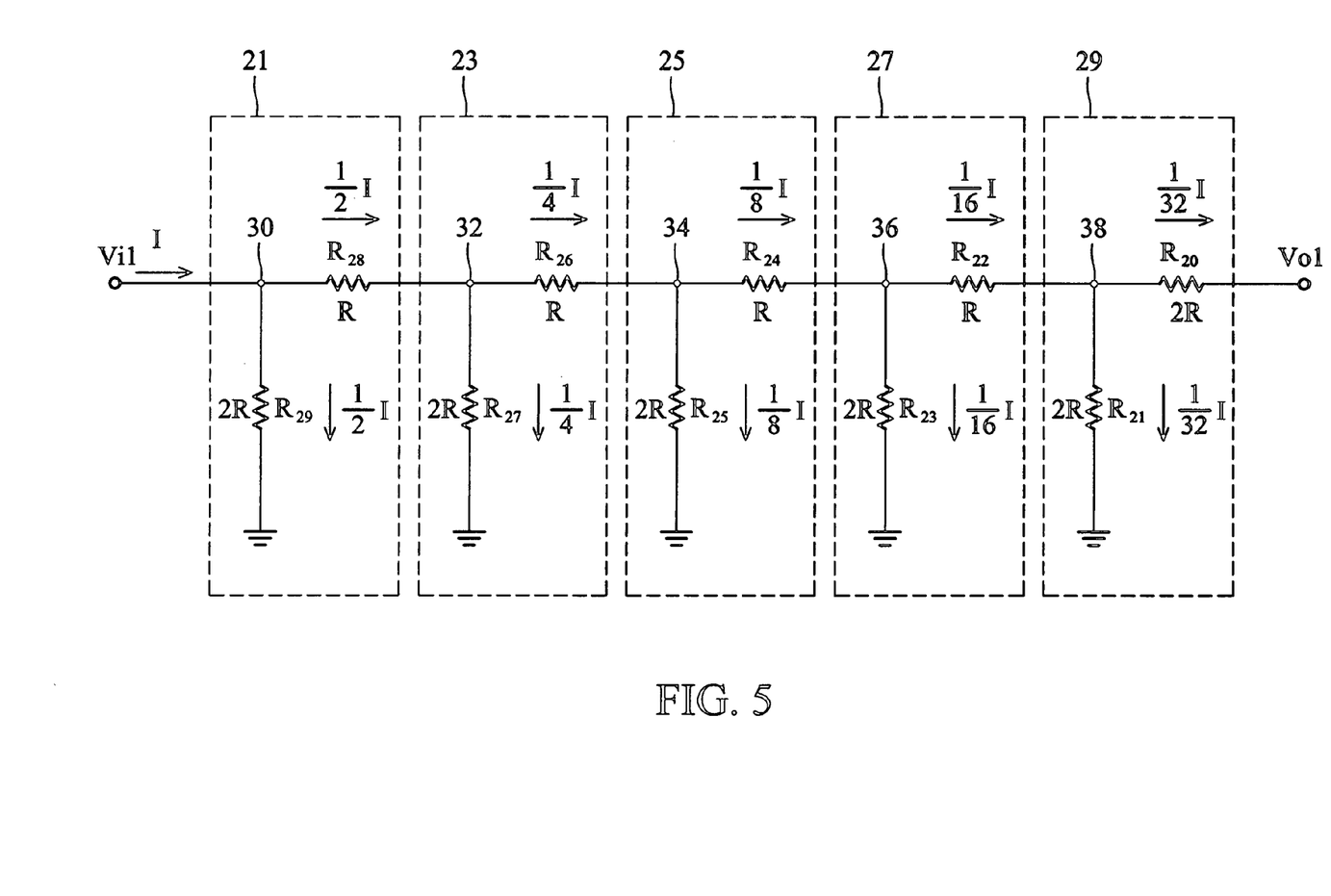
FIG. 5 is a circuit showing a resistor network comprising five stages.

FIG. 5 is a circuit showing a resistor network comprising five stages, which of thereof set in any combination. Here, the resistances of resistors $R_{20}$, $R_{21}$, $R_{23}$, $R_{25}$, $R_{27}$ and $R_{29}$ are set at twice those of resistors $R_{22}$, $R_{24}$, $R_{26}$ and $R_{28}$. The equivalent circuit of the resistor network comprising five stages is such that the resistance of the parallel connection of the resistors $R_{20}$ and $R_{21}$ is 1R, then series connected to the resistor $R_{22}$, such that the equivalent resistance is 2R. Next, the equivalent resistor is connected in parallel to $R_{23}$ and so on. Thus, resistances for both current paths at the nodes 30, 32, 34, 36 and 38 are 2R. Therefore, when the current I is input to the input terminal Vi1, the current value of the current is halved when passing through the nodes 30, 32, 34, 36 and 38, respectively. FIG. 5 also shows the current value on each resistor. Because the circuit structure comprises a resistor network comprising five stages, the current value output from the output terminal Vo1 is $I/2^5$. In addition, the output current is decreased when the stages of the resistor network increase, such that the capacitor is charged for a longer time. Therefore, higher resistance in the semiconductor circuit is obtained by resistor network structure. Moreover, the structure of the resistor network can be changed, for example, by removing the resistor $R_{29}$ or $R_{20}$, removing the resistors $R_{29}$ and $R_{20}$, or increasing the total number of current paths to achieve lower output current.

Figure 6:
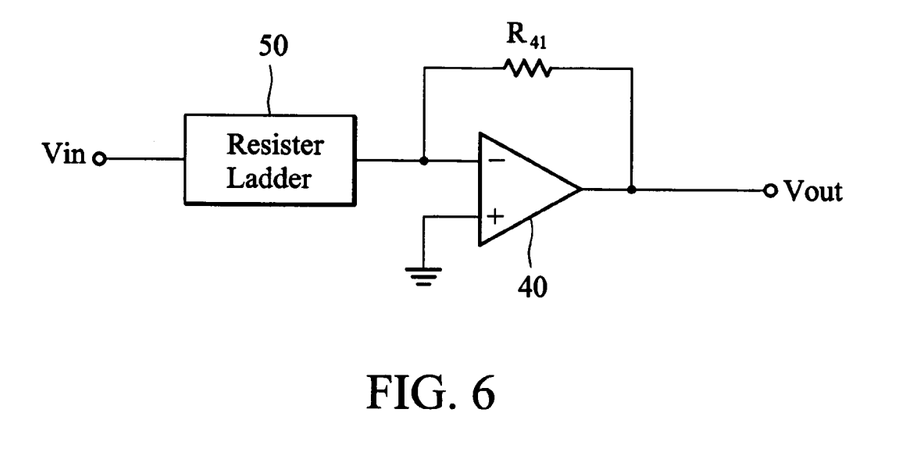
FIG. 6 is a circuit showing the amplifier circuit according to the first embodiment of the present invention.
Figure 7:
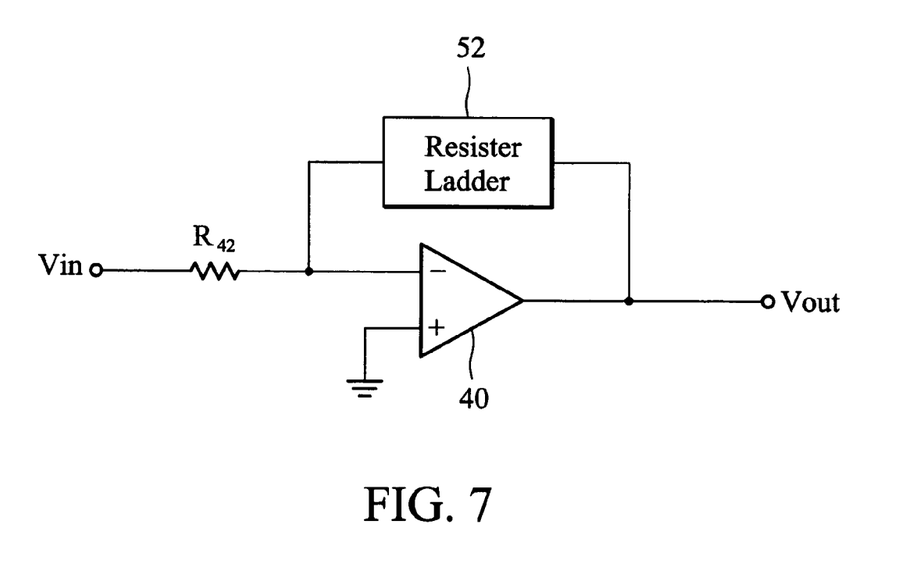
FIG. 7 is a circuit showing the amplifier circuit according to the second embodiment of the present invention.
Figure 8:
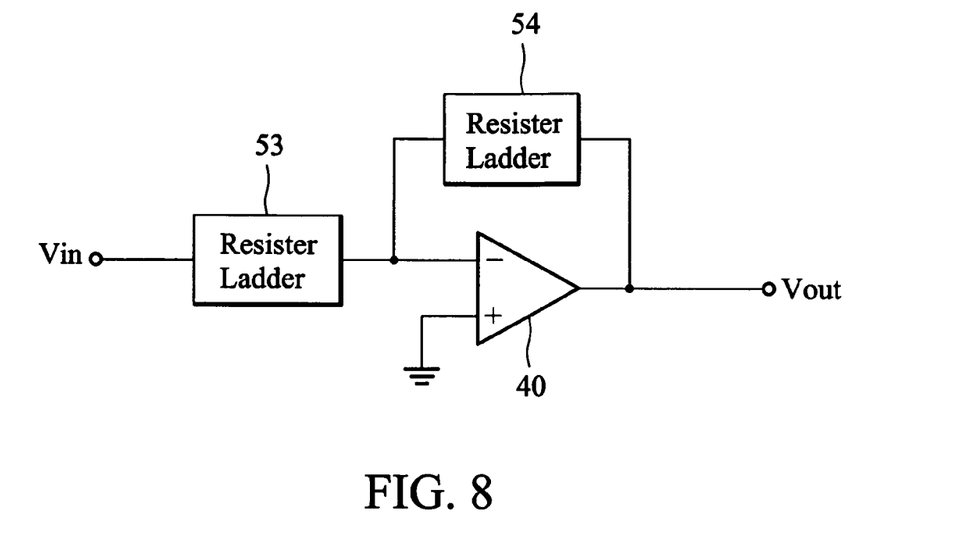
FIG. 8 is a circuit showing the amplifier circuit according to the third embodiment of the present invention.

FIG. 6~FIG. 8 are the diagrams of the amplifier circuits according to the embodiments of the present invention. The amplifier circuit comprises an operational amplifier 40 having a grounded non-inverting input terminal, a inverting input terminal coupled to the input voltage via a first resistor unit, and an output terminal coupled to the inverting input terminal via a second resistor unit. In the embodiments of the present invention, the first resistor unit, the second resistor unit, or both can be implemented by the resistor network disclosed in the present, as shown in FIG. 6, FIG. 7, and FIG. 8 respectively. If the resistor network comprises n stages, the resistance of the equivalent resistor is $R_{eq}=2^N \times R$.

Figure 9:
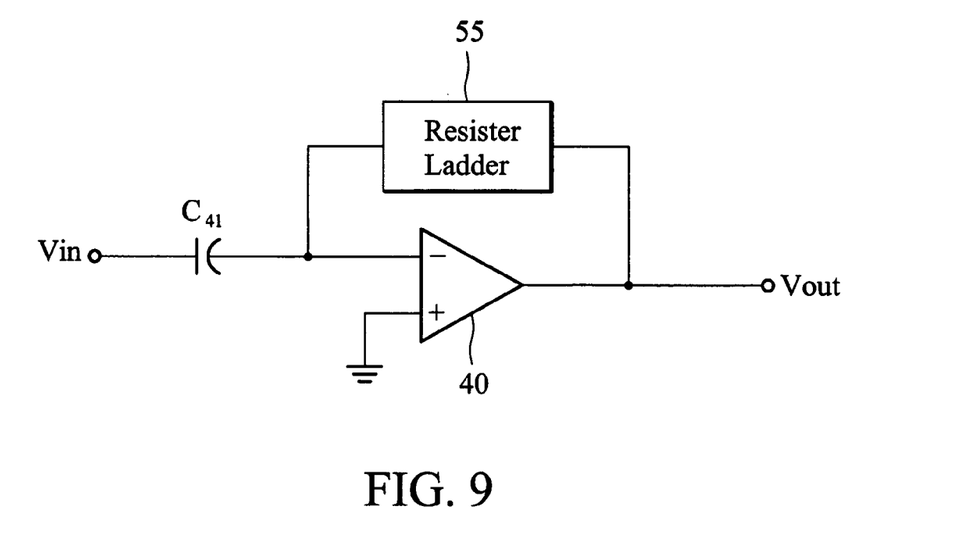
FIG. 9 is a circuit showing the differentiator circuit according to the fourth embodiment of the present invention.

FIG. 9 is a circuit showing the differentiator circuit according to the embodiment of the present invention, comprising an operational amplifier 40 having a grounded non-reverse input terminal, a inverting input terminal coupled to the input voltage via a capacitor C41, and an output terminal coupled to the inverting input terminal via a resistor unit. In the embodiment of the present invention, the resistor unit can be implemented by the resistor network disclosed in the present invention, as shown in FIG. 9. If the resistor network comprises n stages, the resistance of the equivalent resistor is $R_{eq}=2^N \times R$.

Figure 10:
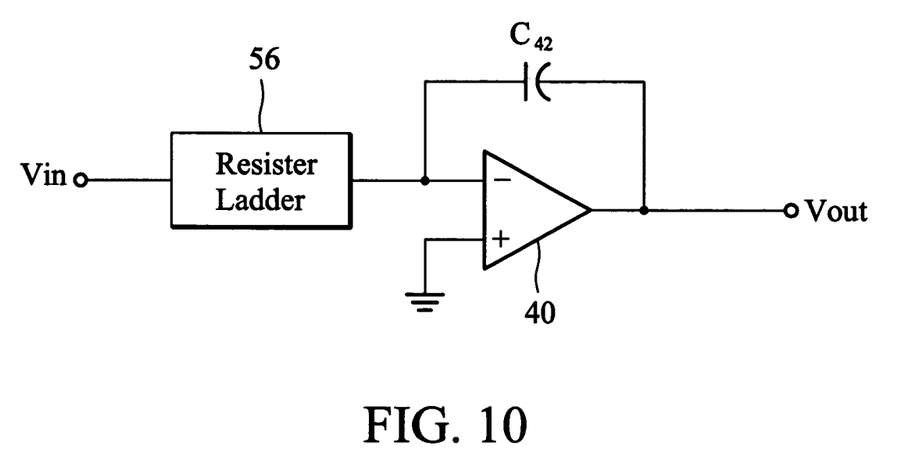
FIG. 10 is a circuit showing the integrator circuit according to the fifth embodiment of the present invention.

FIG. 10 is a circuit showing the integrator circuit according to the embodiment of the present invention, comprising an operational amplifier 40 having a grounded non-reverse input terminal, a inverting input terminal coupled to the input voltage via a resistor unit, and an output terminal coupled to the inverting input terminal via a capacitor C42. In the embodiment of the present invention, the resistor unit can be implemented by the resistor network disclosed in the present invention, as shown in FIG. 10. If the resistor network comprises n stages, the resistance of the equivalent resistor is $R_{eq}=2^N \times R$.

Figure 11:
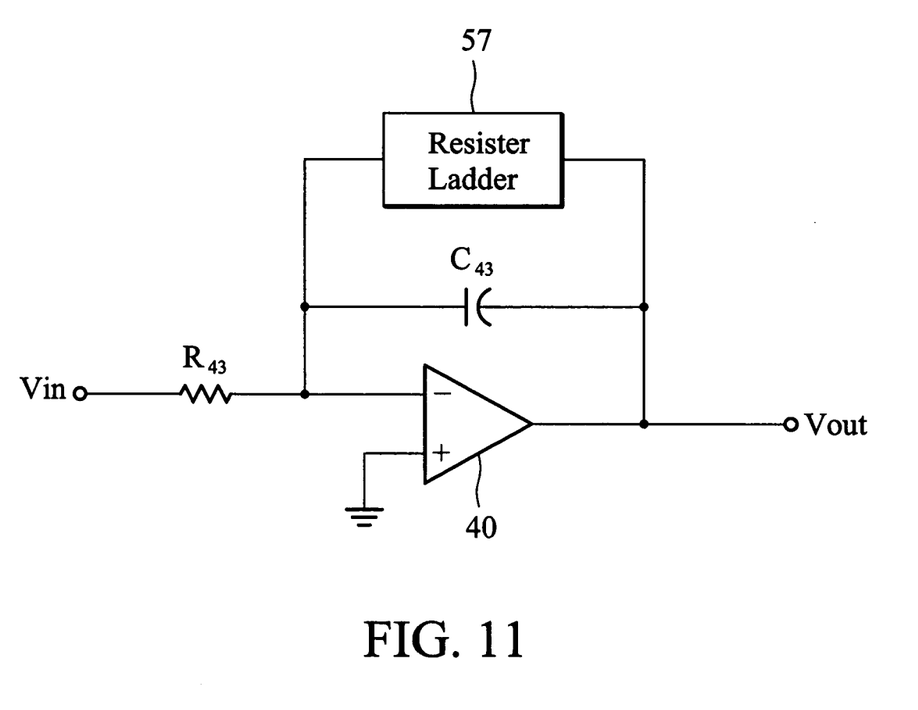
FIG. 11 is a circuit showing the low-pass filter circuit according to the sixth embodiment of the present invention.

FIG. 11 is a circuit showing the low-pass filter circuit according to the embodiment of the present invention, comprising an operational amplifier 40 having a grounded non-reverse input terminal, a inverting input terminal coupled to the input voltage via a resistor R43, and an output terminal coupled to the inverting input terminal via a capacitor C43 and a resistor unit connected in parallel. In the embodiment of the present invention, the resistor unit can be implemented by the resistor network disclosed in the present invention, as shown in FIG. 11. If the resistor network comprises n stages, the resistance of the equivalent resistor is $R_{eq}=2^N \times R$.

Figure 12:
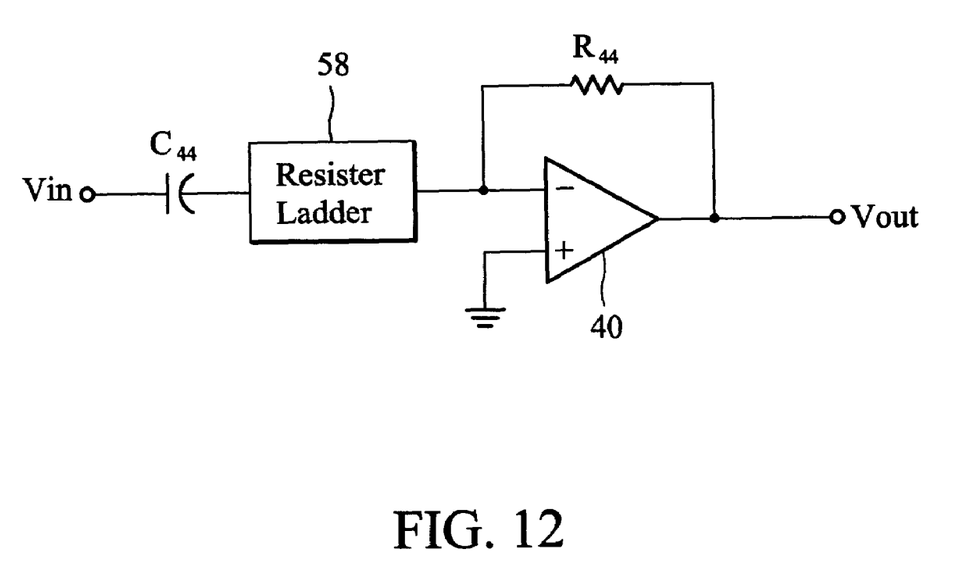
FIG. 12 is a circuit showing the high-pass filter circuit according to the seventh embodiment of the present invention.

FIG. 12 is a circuit showing the high-pass filter circuit according to the embodiment of the present invention, comprising an operational amplifier 40 having a grounded non-reverse input terminal, a inverting input terminal coupled to the input voltage via a resistor unit and a capacitor C44 connected serially, and an output terminal coupled to the inverting input terminal via a resistor R44. In the embodiment of the present invention, the resistor unit can be implemented by the resistor network disclosed in the present invention, as shown in FIG. 12. If the resistor network comprises n stages, the resistance of the equivalent resistor is $R_{eq}=2^N \times R$. The amplifier circuit, the differentiator, the integrator, the high-pass filter and the low-pass filter according to the embodiments of the present invention use the resistor network as resistive loading, so the equivalent resistance of the resistive loading is $R \cdot 2^N$, wherein N represents the stage number of the resistor network. Using resistor network comprising 16 stages as an example, the unit resistance is 0.024 Meg. In addition, the total resistance is only 1.176 Meg. Compared with conventional resistors, the resistor network requires only 1/1353 the resistance of the conventional resistor. Thus, the amplification factors of the amplifiers according to the embodiments of the present invention are more flexible by using the resistor network as the resistive loading. In addition, the differentiator, the integrator, the high-pass filter and the low-pass filter according to the embodiments of the present invention achieve higher time constant using the resistor network as the resistive loading.

In addition, in the present invention, the proportion of resistance on the first current path to that of the second current path is not limited to 1:2, and can be any other value such as 1:3 or 3:2. Moreover, the circuit structure of the resistor network according to the embodiments of the present invention can be adjusted, for example, removing resistor $R_{29}$ or $R_{20}$, resistors $R_{29}$ and $R_{20}$ in FIG. 5, or increasing the total number of current paths to achieve lower output current.

Accordingly, the high equivalent resistance of the resistor network increases the time constant of the amplifier circuit. Thus, higher resistance in the semiconductor device is achieved. Therefore, an ideal time constant of the amplifier circuit according to the embodiments of the present invention is achieved and amplification effect is also improved.

It should be noted that the resistor network disclosed in the embodiments of the present invention is suitable to be implemented inside of the IC device such that the resistor network can be with large resistance without occupying a large area. In addition, each resistor of the resistor network can be implemented by the MOS transistor. The resistance of each resistor and/or the number of the stages of the resistor network can be determined through controlling the gate voltage of the corresponding MOS transistors.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An amplifier circuit, comprising:
    an operational amplifier having a first input terminal, a second input terminal, and an output terminal;
    a capacitive device coupled between the second input terminal and an input voltage; and
    a resistor network comprising a plurality of stages connected serially, coupled between the second input terminal and the output terminal, wherein each stage of the resistor network comprises:
        an input node;
        an output node;
        a first resistor coupled between the input node and a common node; and
        a second resistor coupled between the input node and the output node;
    wherein an input and an output of the resistor network are the input node of the first stage and the output node of the last stage of the resistor network, respectively;
    wherein a current of the input of the resistor network is larger than that of the output of the resistor network such that the amplifier circuit has a large-resistance capacitive time constant.

2. The amplifier circuit as claimed in claim 1, wherein the resistance of the first resistor is approximately two times larger than the resistance of the second resistor.

3. The amplifier circuit as claimed in claim 2, wherein the equivalent resistance of the resistor network is approximately 2n×R, wherein the resistor network includes n stages and the resistance of the second resistor is R.

4. An amplifier circuit, comprising:
    an operational amplifier having a first input terminal, a second input terminal, and an output terminal;
    a first resistor network comprising a plurality of stages connected serially, coupled to the second input terminal for receiving an input voltage, wherein each stage of the first resistor network comprises:
        an input node;
        an output node;
        a first resistor coupled between the input node and a common node; and
        a second resistor coupled between the input node and the output node; and
    a loading unit coupled between the second input terminal and the output terminal;
    wherein the loading unit comprises a second resistor network;
    wherein the second resistor network comprises a plurality of second stages connected serially;
    wherein each second stage of the second resistor network comprises a second input node, a second output node, a third resistor coupled between the second input node and the common node, and a fourth resistor coupled between the second input node and the second output node.

5. The amplifier circuit as claimed in claim 4, wherein the resistance of the first resistor is approximately two times larger than the resistance of the second resistor.

6. The amplifier circuit as claimed in claim 5, wherein the equivalent resistance of the resistor network is approximately 2n×R, wherein the resistor network includes n stages and the resistance of the second resistor is R.

7. The amplifier circuit as claimed in claim 4, wherein the resistance of the third resistor is approximately two times larger than the resistance of the fourth resistor.

8. The amplifier circuit as claimed in claim 7, wherein the equivalent resistance of the second resistor network is approximately 2n×R, wherein the second resistor network includes n stages and the resistance of the fourth resistor is R.

9. The amplifier circuit as claimed in claim 4, wherein the loading unit comprises a capacitive device.

10. The amplifier circuit as claimed in claim 4, further comprising a capacitive device coupled between the first resistor network and the input voltage.

11. An amplifier circuit, comprising:
    an operational amplifier having a first input terminal, a second input terminal, and an output terminal;
    a capacitive device coupled between the second input terminal and the output terminal; and
    a resistor network comprising a plurality of stages connected serially, coupled between the second input terminal and the output terminal, wherein each stage of the resistor network comprises:
        an input node;
        an output node;
        a first resistor coupled between the input node and a common node; and a second resistor coupled between the input node and the output node;

wherein an input and an output of the resistor network are the input node of the first stage and the output node of the last stage of the resistor network, respectively;

wherein a current of the input of the resistor network is larger than that of the output of the resistor network such that the resistor network is operated as a large-resistance resistor.

12. The amplifier circuit as claimed in claim 11, wherein the second input terminal is coupled to an input voltage.

13. The amplifier circuit as claimed in claim 11, wherein the resistance of the first resistor is approximately two times larger than the resistance of the second resistor.

14. The amplifier circuit as claimed in claim 13, wherein the equivalent resistance of the resistor network is approximately $2n \times R$, wherein the resistor network includes n stages and the resistance of the second resistor is R.

15. The amplifier circuit as claimed in claim 11, further comprising a loading unit coupled between the second input terminal and an input voltage.

* * * * *